United States Patent [19]

Goetzberger et al.

[11] 3,953,243

[45] Apr. 27, 1976

[54] METHOD FOR SETTING THE LIFETIME OF CHARGE CARRIERS IN SEMICONDUCTOR BODIES

[75] Inventors: Adolf Goetzberger, Merzhausen; Max Schulz, Gundelfingen; Alois Sonntag, Mulheim, all of Germany

[73] Assignee: LICENTIA-Patent-Verwaltungs-GmbH, Frankfurt am Main, Germany

[22] Filed: Aug. 12, 1974

[21] Appl. No.: 497,143

[30] Foreign Application Priority Data

Aug. 16, 1973 Germany............................ 2341311

[52] U.S. Cl................................. 148/1.5; 148/33; 148/186; 357/91
[51] Int. Cl.².................................... H01L 21/263
[58] Field of Search..................... 148/1.5, 33, 186; 357/91

[56] References Cited

UNITED STATES PATENTS

| | | |
|---|---|---|
| 3,184,347 | 5/1965 | Hoerni................................ 148/33 |
| 3,473,976 | 10/1969 | Castrucci et al................. 148/1.5 X |
| 3,640,783 | 2/1972 | Bailey................................. 148/186 |
| 3,655,457 | 4/1972 | Duffy et al........................... 148/1.5 |

*Primary Examiner*—L. Dewayne Rutledge
*Assistant Examiner*—J. M. Davis
*Attorney, Agent, or Firm*—Spencer & Kaye

[57] ABSTRACT

A method of setting the lifetime of charge carriers in a semiconductor body by the formation of recombination centers in the semiconductor body. The quantity of the recombination centers forming material necessary to provide the desired concentration in the semiconductor body is applied to the surface of the semiconductor body and into the surface thereof by ion implantation, and thereafter, in order to diffuse the material into the semiconductor body, the body is heated until an approximately stationary value for the charge carrier lifetime has developed in the entire volume of the body.

10 Claims, No Drawings

METHOD FOR SETTING THE LIFETIME OF CHARGE CARRIERS IN SEMICONDUCTOR BODIES

BACKGROUND OF THE INVENTION

The present invention relates to an improved method for setting the lifetime of charge carriers in semiconductor bodies for semiconductor devices by the formation of recombination centers in the semiconductor body.

The directed and reproducible setting of the lifetime of charge carriers plays a very important part in the semiconductor art since some properties, such as the frequency limit of planar transistors or the recovery time of thyristors, which properties codetermine the behavior of the semiconductor devices with respect to their dynamic characteristics, are dependent on the lifetime of the charge carriers. It is known that the lifetime of the charge carriers can be reduced, for example, by the diffusion of gold or platinum into a silicon semiconductor body.

Insofar as there exists the requirement of maintaining the recovery time of thyristors within a well defined range, the problem also arises of setting the concentration of the recombination centers in the semiconductor to a defined value. This means, for example, that for high frequency thyristors in which the recovery time is to lie in a range approximately between 5 and 50 $\mu$sec, a gold concentration between about $10^{12}$ and $10^{14}$ atoms $\cdot$ cm$^{-3}$ has to be provided in the silicon body.

The directed and controlled setting of such small concentrations as to quantity, and possibly also sufficient separation according to type of atom, has been unattainable thus far with economically justifiable expenditures. This is so because for a diffusion of recombination centers from the surface it is necessary to have the surface covered with only a very thin layer of the recombination center forming material or substance. For example, for a silicon wafer of the conventional thickness of about 0.3 mm, the surface layer of the material before the diffusion process should be only about $10^{11}$ to $10^{12}$ atoms $\cdot$ cm$^{-2}$, if the concentration of the recombination centers upon completion of the diffusion and with assumed uniform distribution is to reach the above-mentioned values of some $10^{12}$ to some $10^{13}$ atoms $\cdot$ cm$^{-3}$.

Such a thin surface layer in the order of magnitude of $10^{11}$ to $10^{13}$ atoms $\cdot$ cm$^{-2}$ has been unattainable up to now with any of the known and conventionally applied methods. Neither by vapor-deposition nor by chemical or electrolytical means, for example, by deposition from an aqueous solution and subsequent tempering or heating, is it possible to produce such surface coating densities. The devices produced according to such methods practically always exhibit a soft blocking characteristic and thus reduced blocking capability. Presumably the reason for this reduced blocking capability is the particular type of gold diffusion.

The diffusion of, for example, gold into silicon is known to take place according to the Frank-Turnbull Mechanism. (F. C. Frank, D. Turnbull, Phys. Rev. 104, 617 (1956), see also W. M. Bullis Sol. St. Electron. 9, 143 (1966)) According to this mechanism, the gold atoms diffuse initially to the interstitial locations and are then converted, by deposition in vacancies, into substitutionally bound atoms. An equilibrium in concentration between vacancies in the lattice, the interstitial locations and the substitutionally bound atoms is thus produced. Only the gold atoms which are substitutionally incorporated into the lattice have an electrically active effect in this equilibrium, i.e. act as recombination centers.

If during the diffusion process more gold is introduced into the silicon than is required to fill the vacancies, the excess gold must remain at the interstitial locations, where it may possibly be discharged again upon cooling in the form of lumps at crystal dislocations. It is suspected that the reduced blocking capability is a result of this excess gold in the interstitial locations or deposited at the crystal dislocations. Thus there are reasons not to increase the concentration of the gold to the limit of its solubility, which in silicon, for example, lies at about $10^{16}$ atoms $\cdot$ cm$^{-3}$. With such a high gold concentration, the lifetime of the charge carriers would moreover become too short.

SUMMARY OF THE INVENTION

It is the object of the present invention to produce the required carrier lifetime in semiconductor bodies for semiconductor devices by directed and reproducible setting of a concentration of recombination centers which lies below the maximum solubility and is fixed at a level at which, if possible, all of the material producing the recombination centers is deposited in vacancies and does not remain in the interstitial locations so that in this way the thermal and dynamic properties of semiconductor devices, and particularly of high frequency thyristors, are improved.

This is accomplished in a method for setting the lifetime of charge carriers in semiconductor bodies for semiconductor devices by diffusing in recombination centers in such a manner according to the invention that a quantity of the substance forming the recombination centers is applied to the surface and into the surface layer of the semiconductor body by ion implantation, and thereafter the implanted ions are diffused in a heating process until the charge carrier lifetime has become approximately stationary throughout the semiconductor body. The implantation may be effected in semiconductor bodies of uniform conductance and uniform conductivity type as well as in semiconductor bodies having one or a plurality of pn junctions. The implantation energy of the ion beam is advantageously selected so that the penetration depth is at least 50A.

In contradiction to the known processes, the doping of the semiconductor which determines the lifetime is not set by the diffusion temperature and the time but rather by the diffusion of the implanted quantity of material over a sufficiently long period of time.

In particular, the lifetime of charge carriers in a silicon semiconductor body is advantageously realized by implantation of gold into the layers of the body near the surface, after which the silicon body is heated in a protective gas atmosphere at a temperature above 700°C in order to further distribute the implanted gold into the semiconductor volume. The lifetime of the charge carriers can be set, if required, also by means of the ion implantation of platinum instead of by the ion implantation of gold.

The method according to the invention makes it possible for even the small quantities of material needed for surface coating densities in the order of magnitude of about $10^{10}$ to $10^{13}$ atoms $\cdot$ cm$^{-2}$ to be handled and to be handled safely. Thus the above-mentioned possible drawbacks resulting from too high a recombination center forming impurity concentration in the range of the solubility limit, such as the discharge of no longer dissolved portions in the metallic state during cooling and the resulting damaging electrical side effects, are dependably avoided.

It is moreover possible to accurately provide such small quantities of material as mentioned above under economically justifiable expenditures because the quantity of material to be introduced during the ion implantation can relatively easily be determined and controlled by electrical measurements.

A further advantage of the initial ion implantation is that during the introduction of the doping substance a mass selection and a limitation to the sole impurity element provided is effected, so that the danger of the diffusion of undesirable impurities and their possible disadvantageous influences are avoided.

Moreover, when the method of the present invention is employed, the actual diffusion process is also facilitated and can be better controlled. After the implantation, the doping substance is already deposited sufficiently deeply below the surface of the semiconductor body so that the diffusion thereof into the interior of the semiconductor body will no longer by impeded by any oxide film on the surface of the body. Thus the diffusion front and hence the subsequent distribution becomes more uniform.

Finally, the method according to the invention has the advantage that the setting of the concentration level for the impurities in the final distribution is determined substantially by the safely managed quantity of implanted impurities, which is not the case in the prior art methods.

DETAILED DESCRIPTION OF THE PREFERRED EMBODIMENTS

The method of the present invention will be explained in detail and the operating conditions for the ion implantation given. Silicon was selected as the semiconductor material and it is to be doped with gold to form the recombination centers. The starting material is a diffused silicon wafer with a thickness of about 0.3 mm. The surface coating of the gold is to be between $1 \cdot 10^{11}$ and $5 \cdot 10^{13}$ gold atoms·cm$^{-2}$ to provide the desired final gold concentration throughout the semiconductor wafer.

The implantation of the ions of the recombination center forming material, in the instant case gold, is carried out by means of ion beam apparatus of the type well known in the art. An apparatus suitable for this purpose is, for example, disclosed in G. Dearnaley, J. H. Freeman, R. S. Nelson, J. Stephen, "Ion Implantation" Series on Defects in Cryst. Solids Vol. 8, North-Holland Publishing Co. 1973.

The ion implantation of the recombination center forming substance, such as gold for example, takes place with a sufficiently high energy for the ion beam that a sufficient penetration depth, at least 50A, is attained and sputtering of the semiconductor surface is avoided. For gold the penetration depth is 100 to 1000A with an energy of 10 to 300 KeV. On the other hand, too high an implantation energy will be so damaging that adverse effects occur during the gold diffusion. Favorable values for the implantation energy lie at about 100 KeV, resulting in a penetration depth for gold of about 500A. The implanted quantity of gold ions is controlled in a known manner, by controlling the ion current. Moreover, by properly selecting the ion masses in the magnetic field of the ion beam apparatus, high purity of the implanted material is assured.

After the implantation of the gold, the thus prepared semiconductor wafers are heated in a protective gas atmosphere, for example, hydrogen, nitrogen, argon or another inert gas for a duration of from a few minutes up to several hours at a temperature above 700°C, preferably between 800° and 1000°C in order to cause the implanted ions to diffuse throughout the volume of the semiconductor wafer to produce the desired charge carrier lifetime.

Gold concentrations in silicon wafers have been analysed by radio tracer methods. Good proportionality to the implanted gold dose was obtained. For a redistribution anneal at 1000°C, the adjustment of the gold concentration could be obtained at an accuracy better than 2%.

It will be understood that the above description of the present invention is susceptible to various modifications, changes and adaptations, and the same are intended to be comprehended within the meaning and range of equivalents of the appended claims.

We claim:

1. Method for setting the lifetime of charge carriers in semiconductor bodies for semiconductor devices by the diffusion of recombination centers, comprising: applying the recombination center forming material to the surface and into the surface layer of the semiconductor body in a quantity which corresponds to the desired final concentration of said material in the semiconductor body by means of ion implantation; and heating the semiconductor body to a temperature sufficient to cause diffusion of the implanted ions into the remainder of the semiconductor body until an approximately stationary value for the charge carrier lifetime has developed in the entire volume of the semiconductor body.

2. The method defined in claim 1 wherein the implantation energy is selected so that the penetration depth is at least 50A.

3. The method defined in claim 2 wherein gold is implanted as the recombination center forming material.

4. The method defined in claim 2 wherein platinum is implanted as the recombination center forming material.

5. The method defined in claim 3 wherein the semiconductor body is formed of silicon.

6. The method defined in claim 4 wherein the semiconductor body is formed of silicon.

7. The method defined in claim 1 wherein said step of diffusing further includes heating the semiconductor body in a protective gas atmosphere of hydrogen.

8. The method defined in claim 7 wherein said step of heating is carried out at a temperature of more than 700°C.

9. The method defined in claim 8 wherein said temperature is between 800° and 1000°C.

10. The method defined in claim 1 wherein said quantity of recombination center forming material is in the order of magnitude of about $10^{10}$ to $10^{13}$ atoms·cm$^{-2}$.

* * * * *